(12) United States Patent
Li et al.

(10) Patent No.: US 9,859,521 B2
(45) Date of Patent: Jan. 2, 2018

(54) FLEXIBLE OLED AND MANUFACTURE METHOD THEREOF

(71) Applicant: Shenzhen China Star Optoelectronics Technology Co., Ltd., Shenzhen (CN)

(72) Inventors: Wenhui Li, Shenzhen (CN); Wen Shi, Shenzhen (CN); Yanhong Meng, Shenzhen (CN); Tao Sun, Shenzhen (CN); Shimin Ge, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 186 days.

(21) Appl. No.: 14/770,821

(22) PCT Filed: May 28, 2015

(86) PCT No.: PCT/CN2015/080049
§ 371 (c)(1),
(2) Date: Aug. 27, 2015

(87) PCT Pub. No.: WO2016/176886
PCT Pub. Date: Nov. 10, 2016

(65) Prior Publication Data
US 2017/0155077 A1    Jun. 1, 2017

(30) Foreign Application Priority Data

May 6, 2015    (CN) .......................... 2015 1 0227678

(51) Int. Cl.
*H01L 51/52*    (2006.01)
*H01L 51/00*    (2006.01)
*H01L 27/32*    (2006.01)

(52) U.S. Cl.
CPC ...... *H01L 51/5228* (2013.01); *H01L 51/0022* (2013.01); *H01L 51/5259* (2013.01); *H01L 27/3244* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2001/0011868 A1* | 8/2001 | Fukunaga | H01L 51/0097 313/506 |
| 2004/0178722 A1* | 9/2004 | Cok | H01L 51/5206 313/506 |

(Continued)

FOREIGN PATENT DOCUMENTS

| CN | CN1471065 A | 1/2004 |
|---|---|---|
| CN | CN102074167 A | 5/2011 |
| CN | CN104124259 A | 10/2014 |

*Primary Examiner* — Michael Lebentritt
(74) *Attorney, Agent, or Firm* — Leong C. Lei

(57) ABSTRACT

The present invention provides a flexible OLED and a manufacture method thereof. The flexible OLED is capable of decreasing the resistance of the second electrode (12) and increasing the conducting ability to even the voltages of respective pixels, to improve the display homogeneity, and meanwhile, capable of reducing the thickness of the second electrode (12) and saving the material of the second electrode (12) by covering the auxiliary conducting layer (13) on the second electrode (12). The manufacture method of the flexible OLED is capable of decreasing the resistance of the second electrode (12) and increasing the conducting ability to even the voltages of respective pixels, to improve the display homogeneity, and meanwhile, capable of reducing the thickness of the second electrode (12) and saving the material of the second electrode (12) by forming the auxiliary conducting layer (13) on the second electrode (12) to cover the second electrode (12).

12 Claims, 5 Drawing Sheets

(56) References Cited

U.S. PATENT DOCUMENTS

| | | | |
|---|---|---|---|
| 2005/0077814 A1* | 4/2005 | Koo | H01L 27/3244 313/500 |
| 2005/0236629 A1* | 10/2005 | Lee | H01L 27/3276 257/79 |
| 2011/0248269 A1* | 10/2011 | Oh | B82Y 10/00 257/59 |
| 2014/0077196 A1* | 3/2014 | Shim | H01L 27/3246 257/40 |
| 2014/0312337 A1* | 10/2014 | Isobe | H01L 51/5231 257/40 |
| 2015/0008400 A1* | 1/2015 | Kim | H01L 27/3279 257/40 |
| 2015/0097171 A1* | 4/2015 | Kim | H01L 27/3246 257/40 |
| 2016/0027935 A1* | 1/2016 | Naito | H01L 31/1884 438/98 |
| 2016/0088756 A1* | 3/2016 | Ramadas | H01L 51/5259 361/728 |
| 2016/0104859 A1* | 4/2016 | Kim | H01L 51/5228 257/40 |
| 2016/0104867 A1* | 4/2016 | Lee | H01L 51/5234 257/40 |
| 2016/0190225 A1* | 6/2016 | Kim | H01L 27/3276 257/40 |
| 2016/0211316 A1* | 7/2016 | Oh | H01L 27/3279 |
| 2016/0233458 A1* | 8/2016 | Shen | H01L 51/5228 |
| 2017/0010497 A1* | 1/2017 | Kim | G02F 1/13439 |

\* cited by examiner

FLEXIBLE OLED AND MANUFACTURE METHOD THEREOF

FIELD OF THE INVENTION

The present invention relates to a display technology field, and more particularly to a flexible OLED and a manufacture method thereof.

BACKGROUND OF THE INVENTION

The Organic Light Emitting Diode (OLED) possesses many advantages of outstanding properties of self-illumination, low driving voltage, high luminescence efficiency, fast response, high clarity and contrast, near 180° view angle, wide range of working temperature, applicability of flexible display and large scale full color display, and has been drawn a lot of attentions and is considered to be a new generation display to gradually replace the traditional displays. Thus, it has been widely applied in cellular phone screens, computer displays, full color TV, etc. The OLED display is different from the traditional liquid crystal display and the back light is not required. It utilizes an ultra thin organic material coating layer and a glass substrate, and theses organic material will illuminate when the current is conducted.

Please refer to FIG. 1, which is a sectional structure diagram of a flexible OLED according to prior art, which comprises a substrate 100, a first gate 210 and a second gate 220 separately positioned on the substrate 100, a gate isolation layer 300 positioned on the first gate 210, the second gate 220 and the substrate 100, a first semiconductor layer 410 positioned on the gate isolation layer 300 above the first gate 210, a second semiconductor layer 420 positioned on the gate isolation layer 300 above the second gate 220, an etching stopper layer 500 positioned on the first semiconductor layer 410, the second semiconductor layer 420 and the gate isolation layer 300, a first source 610, a first drain 620, a second drain 630 and a second drain 640 positioned on the etching stopper layer 500, an interlayer insulation layer 700 positioned on the first source 610, the first drain 620, the second drain 630, the second drain 640 and the etching stopper layer 500 and a flat layer 800 positioned on the interlayer insulation layer 700, a first electrode 900 positioned on the flat layer 800, a pixel definition layer 1000 having an open, positioned on the first electrode 900 and the flat layer 800, and an organic light emitting layer 1100 positioned on the first electrode 900 in the open of the pixel definition layer 1000, and a second electrode 1200 positioned on the pixel definition layer 1000 and the organic light emitting layer 1100, and a dryer layer 1300 positioned on the second electrode 1200, and a package thin film 1400 positioned on the dryer layer 1300 and the pixel definition layer 1000.

The first source 610 contacts the first semiconductor layer 410 and the second gate 220, and the first drain 610 contacts the first semiconductor layer 410, and the second source 630 contacts the second semiconductor layer 420, and the second drain 640 contacts the second semiconductor layer 420. The first gate 210, the first semiconductor layer 410, the first source 610 and the first drain 620 constructs a switch TFT T10, and the second gate 220, the second semiconductor layer 420, the second source 630 and the second drain 640 construct a drive TFT T20. The first electrode 900 contacts the second source 630. The open of the pixel definition layer 1000 exposes a portion of the first electrode 900.

The first electrode 900 is employed as being the pixel electrode, i.e. the anode of the OLED. The second electrode 1200 is employed as being the cathode of the OLED. Generally, the second electrode 1200 is thinner, and particularly in the top light emitting type OLED, the transparent cathode has to be manufacture. Thus, a thinner second electrode 1200 is demanded. However, under circumstance that the second electrode 1200 becomes thinner, the resistance is larger, and the conductivity is weaker. For the large scale OLED display, it can cause the uneven voltages for the respective pixels. The display homogeneity will be influenced and the mura issue can happen.

SUMMARY OF THE INVENTION

An objective of the present invention is to provide a flexible OLED capable of decreasing the resistance of the second electrode and increasing the conducting ability to even the voltages of respective pixels, to improve the display homogeneity, and meanwhile, capable of reducing the thickness of the second electrode and saving the material of the second electrode.

An objective of the present invention is to provide a manufacture method of a flexible OLED, and the flexible OLED manufactured by the method is capable of decreasing the resistance of the second electrode and increasing the conducting ability to even the voltages of respective pixels, to improve the display homogeneity, and meanwhile, capable of reducing the thickness of the second electrode and saving the material of the second electrode.

For realizing the aforesaid objectives, the present invention provides a flexible OLED, comprising a TFT substrate, having a first electrode and a pixel definition layer on the TFT substrate, and the pixel definition layer has an open to expose a portion of the first electrode;

an organic light emitting layer, and the organic light emitting layer is positioned on the first electrode in accordance with the open of the pixel definition layer;

a second electrode, and the second electrode is positioned on the organic light emitting layer and the pixel definition layer;

an auxiliary conducting layer, and the auxiliary conducting layer covers the second electrode;

a dryer layer, and the dryer layer is positioned on the auxiliary conducting layer; and a package thin film, and the package thin film is positioned on the dryer layer and the pixel definition layer.

A value range of a square resistance of the second electrode is 0.1-100Ω/□.

A thickness of the second electrode is 10~1000 Å.

Material of the auxiliary conducting layer is conductive silver glue, silver nanowire or graphene.

The auxiliary conducting layer appears to be a mesh.

The present invention further provides a manufacture method of a flexible OLED, comprising steps of:

step 1, providing a TFT substrate, and sequentially forming a pixel electrode, and a pixel definition layer having an open to expose a portion of the first electrode on the TFT substrate;

and then, forming an organic light emitting layer on the first electrode in accordance with the open of the pixel definition layer;

and then, forming a second electrode on the organic light emitting layer and the pixel definition layer;

step 2, forming an auxiliary conducting layer covering the second electrode on the second electrode;

step 3, filling a dryer layer on the auxiliary conducting layer;

step 4, forming a package thin film on the dryer layer and the pixel definition layer.

In the step 2, coat, ink inject print or deposition is employed to form the auxiliary conducting layer.

Material of the auxiliary conducting layer is conductive silver glue, silver nanowire or graphene.

A value range of a square resistance of the second electrode is 0.1-100Ω/□; and a thickness of the second electrode is 10~1000 Å.

The auxiliary conducting layer appears to be a mesh.

The present invention further provides a manufacture method of a flexible OLED, comprising steps of:

step 1, providing a TFT substrate, and sequentially forming a pixel electrode, and a pixel definition layer having an open to expose a portion of the first electrode on the TFT substrate;

and then, forming an organic light emitting layer on the first electrode in accordance with the open of the pixel definition layer;

and then, forming a second electrode on the organic light emitting layer and the pixel definition layer;

step 2, forming an auxiliary conducting layer covering the second electrode on the second electrode;

step 3, filling a dryer layer on the auxiliary conducting layer;

step 4, forming a package thin film on the dryer layer and the pixel definition layer;

wherein in the step 2, coat, ink inject print or deposition is employed to form the auxiliary conducting layer;

wherein material of the auxiliary conducting layer is conductive silver glue, silver nanowire or graphene;

wherein a value range of a square resistance of the second electrode is 0.1-100Ω/□; and a thickness of the second electrode is 10~1000 Å.

The benefits of the present invention are: the flexible OLED provided by the present invention is capable of decreasing the resistance of the second electrode and increasing the conducting ability to even the voltages of respective pixels, to improve the display homogeneity, and meanwhile, capable of reducing the thickness of the second electrode and saving the material of the second electrode by covering the auxiliary conducting layer on the second electrode. The manufacture method of the flexible OLED provided by the present invention is capable of decreasing the resistance of the second electrode and increasing the conducting ability to even the voltages of respective pixels, to improve the display homogeneity, and meanwhile, capable of reducing the thickness of the second electrode and saving the material of the second electrode by forming the auxiliary conducting layer on the second electrode to cover the second electrode.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 2:
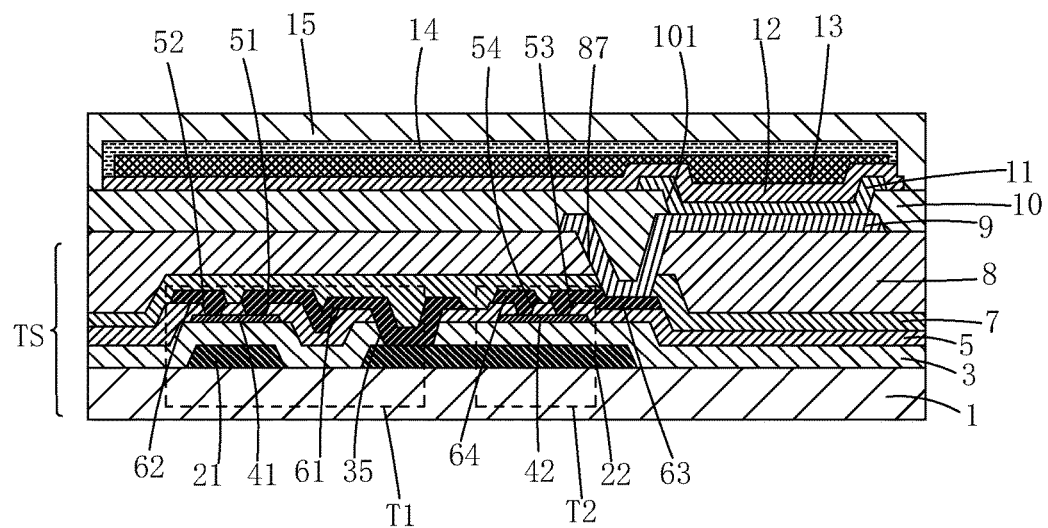
FIG. 2 is a sectional structure diagram of a flexible OLED according to the present invention.

Please refer to FIG. 2. The present invention first provides a flexible OLED, comprising a TFT substrate TS, a first electrode 9 and a pixel definition layer 10 on the TFT substrate TS, an organic light emitting layer 11, a second electrode 12, an auxiliary conducting layer 13, a dryer layer 14 and a package thin film 15.

Specifically, the TFT substrate TS comprises a substrate 1, a first gate 21 and a second gate 22 separately positioned on the substrate 1, a gate isolation layer 3 positioned on the first gate 21, the second gate 22 and the substrate 1, a first semiconductor layer 41 positioned on the gate isolation layer 3 above the first gate 21, a second semiconductor layer 42 positioned on the gate isolation layer 3 above the second gate 22, an etching stopper layer 5 positioned on the first semiconductor layer 41, the second semiconductor layer 42 and the gate isolation layer 3, a first source 61, a first drain 62, a second drain 63 and a second drain 64 positioned on the etching stopper layer 5, an interlayer insulation layer 7 positioned on the first source 61, the first drain 62, the second drain 63, the second drain 64 and the etching stopper layer 5 and a flat layer 8 positioned on the interlayer insulation layer 7.

The first electrode 9 is positioned on the flat layer 8, and the pixel definition layer 10 has an open 101 to expose a portion of the first electrode 9 to define the shape of the pixel area.

The first source 61 contacts the first semiconductor layer 41 and the second gate 22, and the first drain 62 contacts the first semiconductor layer 41, and the second source 63 contacts the second semiconductor layer 42, and the second drain 64 contacts the second semiconductor layer 42; the first gate 21, the first semiconductor layer 41, the first source 61 and the first drain 62 constructs a switch TFT T1, and the second gate 22, the second semiconductor layer 42, the second source 63 and the second drain 64 construct a drive TFT T2; the first electrode 9 contacts the second source 63. Furthermore, the first source 61 and the first drain 62 respectively contact the first semiconductor layer 41 through a first via 51, a second via 52 penetrating a passivation layer 5, and the second source 63 and the second drain 64 respectively contact the second semiconductor layer 42 through a third via 53, a fourth via 54 penetrating the passivation layer 5 and the first source 61 contacts the second gate 22 through a fifth via 35 penetrating the passivation layer 5 and the gate isolation layer 3, and the first electrode 9 contacts the second source 63 through a sixth via 87 penetrating the flat layer 8 and the interlayer insulation layer 7.

Material of the first semiconductor layer 41 and the second semiconductor layer 42 is polysilicon semiconductor or metal oxide semiconductor, such as Indium Gallium Zinc Oxide (IGZO) semiconductor.

Material of the first gate 21, the second gate 22, the first source 61, the first drain 62, the second source 63 and the second drain 64 is a stack combination of one or more of molybdenum, titanium, aluminum and copper.

Material of the gate isolation layer 3 and the interlayer insulation layer 7 is Silicon Nitride, Silicon Oxide, or a combination of the two;

the first electrode 9 is a pixel electrode which generally is employed as being an anode of the OLED, and Indium Tin Oxide (ITO) is selected as the material.

The organic light emitting layer 11 is positioned on the first electrode 9 in accordance with the open 101 of the pixel definition layer 10.

The second electrode 12 is positioned on the organic light emitting layer 11 and the pixel definition layer 10. The second electrode 12 is generally employed as being a cathode of the OLED.

The auxiliary conducting layer 13 covers the second electrode 12. Preferably, the auxiliary conducting layer 13 appears to be a mesh shown in FIG. 3. Material of the auxiliary conducting layer 13 is conductive silver glue, silver nanowire or graphene. The silver nanowire means the transparent conductive thin film having nano level silver conductive mesh, and the line width of the silver nanowire is about 50 nm.

The dryer layer 14 is positioned on the auxiliary conducting layer 13 for removing the water vapor.

The package thin film 15 is positioned on the dryer layer 14 and the pixel definition layer 10 for protecting the inner structure of the OLED.

Figure 1:
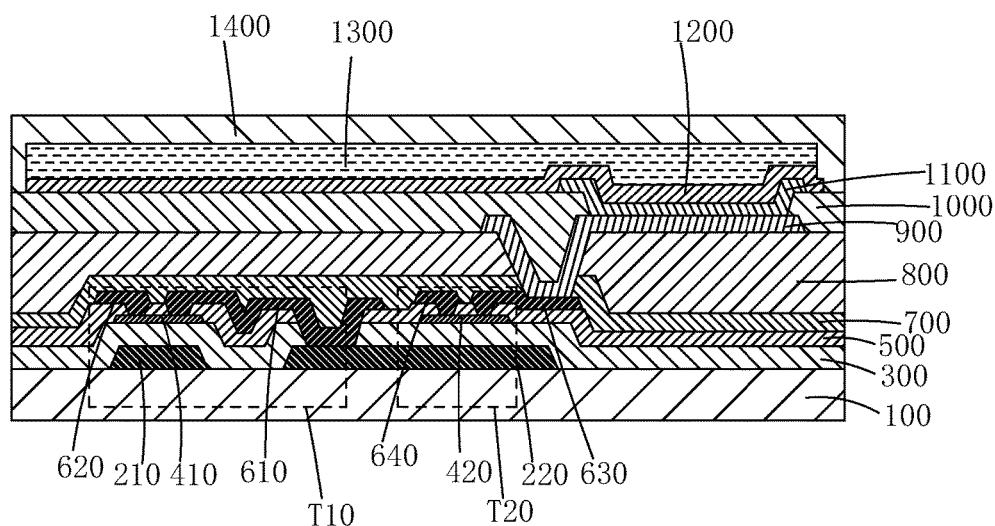
FIG. 1 is a sectional structure diagram of a flexible OLED according to prior art.

Generally, the second electrode is a plane type common electrode of a whole sheet. In the top light emitting type OLED according to prior art shown in FIG. 1, the transparent cathode has to be manufactured. Thus, the thickness of the second electrode 1200, i.e. the cathode has to be very thin. The small thickness consequently increase the electrical resistivity and causes the voltage difference between the central area and the peripheral edge area of the electrode 1200. The current is blocked to be conducted from the peripheral edge area to the central area to cause the current difference. Accordingly, the brightness of the OLED has difference, and the issue of the uneven brightness happens. The auxiliary conducting layer 13 is added on the second electrode 12 in the flexible OLED of the present invention. With the auxiliary conducting layer 13, the current is conducted from the peripheral edge area to the central area of the electrode 12 and the voltage difference between the central area and the peripheral edge area of the electrode 12 can be decreased to diminish the current difference, and the brightness difference of the OLED. The issue of the uneven brightness can be improved; that is to say, even the thickness of the second electrode 12 is decreased, the conductivity still can be enhanced with the auxiliary conducting layer 13 to make the voltage difference between the central area and the peripheral edge area of the electrode 12 smaller.

In prior art, a value range of a square resistance of the second electrode is 0.5-500Ω/□, and after adding the auxiliary conducting layer 13 to the flexible OLED of the present invention, a value range of a square resistance of the second electrode 12 is narrowed down to 0.1-100Ω/□.

In prior art, a thickness of the second electrode is 50-2000 Å, and after adding the auxiliary conducting layer 13 to the flexible OLED of the present invention, a thickness of the second electrode 12 is 10-1000 Å.

As aforementioned, the flexible OLED of the present invention covers the auxiliary conducting layer 13 on the second electrode 12 and is capable of decreasing the resistance of the second electrode 12 and increasing the conducting ability to even the voltages of respective pixels, to improve the display homogeneity, and meanwhile, capable of reducing the thickness of the second electrode 12 and saving the material of the second electrode 12.

Figure 4:
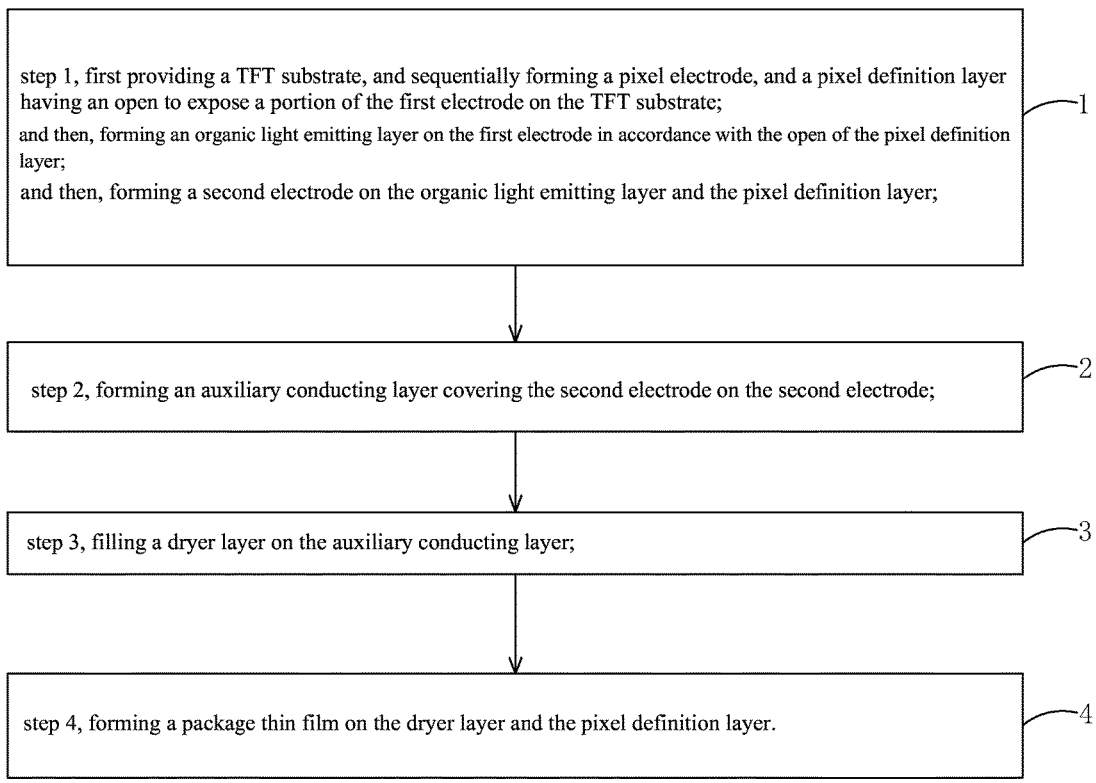
FIG. 4 is a flowchart of a manufacture method of a flexible OLED according to the present invention.
Figure 5:
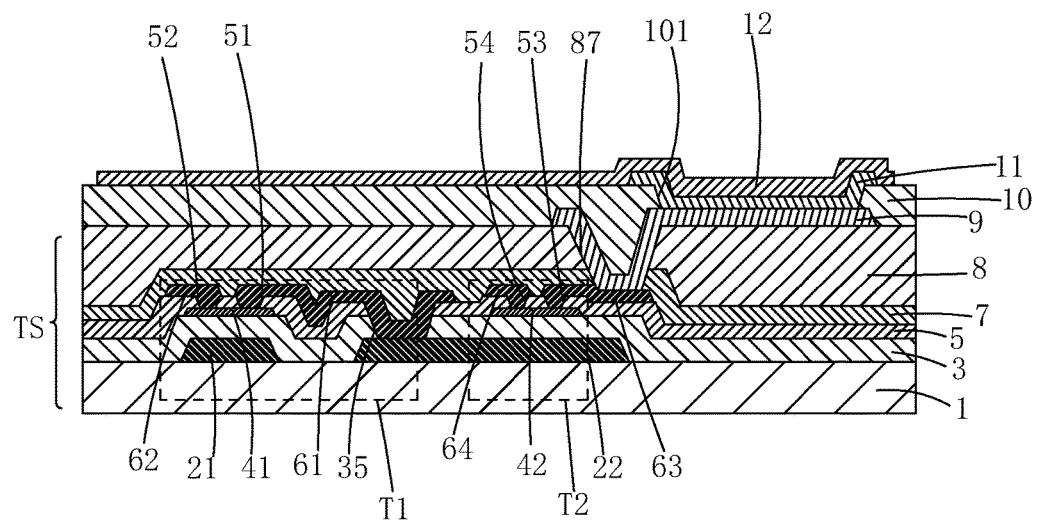
FIG. 5 is a diagram of the step 1 of the manufacture method of the flexible OLED according to the present invention.

Please refer to FIG. 4. On the basis of the same inventive idea, the present invention further provides a manufacture method of a flexible OLED, comprising steps of:

step 1, as shown in FIG. 5, first providing a TFT substrate TS, and sequentially forming a pixel electrode 9, and a pixel definition layer 10 having an open 101 to expose a portion of the first electrode 9 on the TFT substrate TS;

and then, forming an organic light emitting layer 11 on the first electrode 9 in accordance with the open 101 of the pixel definition layer 10;

and then, forming a second electrode 12 on the organic light emitting layer 11 and the pixel definition layer 10.

Specifically, the TFT substrate TS comprises a substrate 1, a first gate 21 and a second gate 22 separately positioned on the substrate 1, a gate isolation layer 3 positioned on the first gate 21, the second gate 22 and the substrate 1, a first semiconductor layer 41 positioned on the gate isolation layer 3 above the first gate 21, a second semiconductor layer 42 positioned on the gate isolation layer 3 above the second gate 22, an etching stopper layer 5 positioned on the first semiconductor layer 41, the second semiconductor layer 42 and the gate isolation layer 3, a first source 61, a first drain 62, a second drain 63 and a second drain 64 positioned on the etching stopper layer 5, an interlayer insulation layer 7 positioned on the first source 61, the first drain 62, the second drain 63, the second drain 64 and the etching stopper layer 5 and a flat layer 8 positioned on the interlayer insulation layer 7.

The first source 61 contacts the first semiconductor layer 41 and the second gate 22, and the first drain 62 contacts the first semiconductor layer 41, and the second source 63 contacts the second semiconductor layer 42, and the second drain 64 contacts the second semiconductor layer 42; the first gate 21, the first semiconductor layer 41, the first source 61 and the first drain 62 constructs a switch TFT T1, and the second gate 22, the second semiconductor layer 42, the second source 63 and the second drain 64 construct a drive TFT T2; the first electrode 9 contacts the second source 63; the pixel definition layer 10 has an open 101 to expose a portion of the first electrode 9 to define the shape of the pixel area. Furthermore, the first source 61 and the first drain 62 respectively contact the first semiconductor layer 41 through a first via 51, a second via 52 penetrating a passivation layer 5, and the second source 63 and the second drain 64 respectively contact the second semiconductor layer 42 through a third via 53, a fourth via 54 penetrating the passivation layer 5, and the first source 61 contacts the second gate 22 through a fifth via 35 penetrating the passivation layer 5 and the gate isolation layer 3, and the first electrode 9 contacts the second source 63 through a sixth via 87 penetrating the flat layer 8 and the interlayer insulation layer 7.

Material of the first semiconductor layer 41 and the second semiconductor layer 42 is polysilicon semiconductor or metal oxide semiconductor, such as IGZO semiconductor.

Material of the first gate 21, the second gate 22, the first source 61, the first drain 62, the second source 63 and the second drain 64 is a stack combination of one or more of molybdenum, titanium, aluminum and copper.

Material of the gate isolation layer 3 and the interlayer insulation layer 7 is Silicon Nitride, Silicon Oxide, or a combination of the two;

The first electrode 9 is a pixel electrode which generally is employed as being an anode of the OLED, and ITO is selected as the material.

Figure 6:
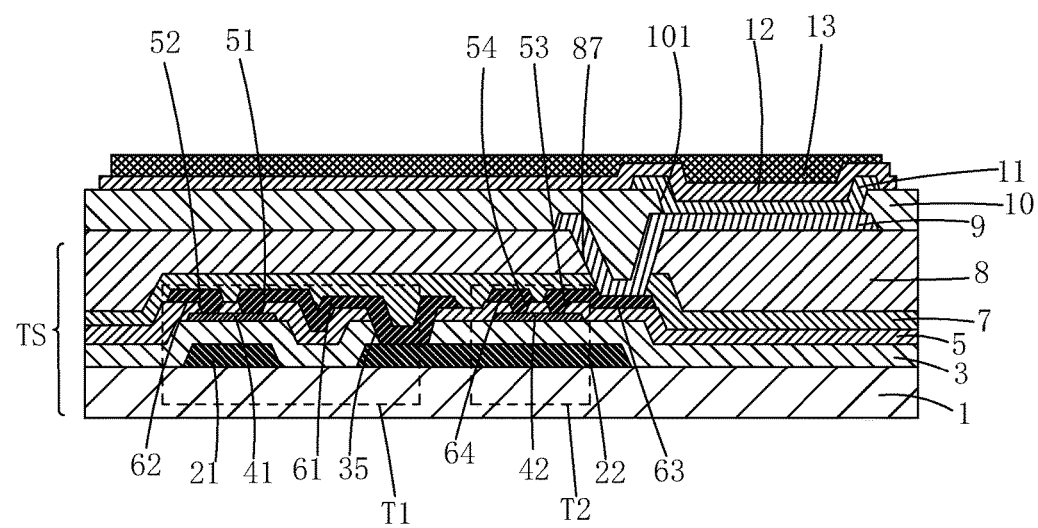
FIG. 6 is a diagram of the step 2 of the manufacture method of the flexible OLED according to the present invention.

The second electrode 12 is generally employed as being a cathode of the OLED.

step 2, as shown in FIG. 6, coat, ink inject print or deposition is employed to form the auxiliary conducting layer 13 covering the second electrode 12 on the second electrode 12.

Figure 3:
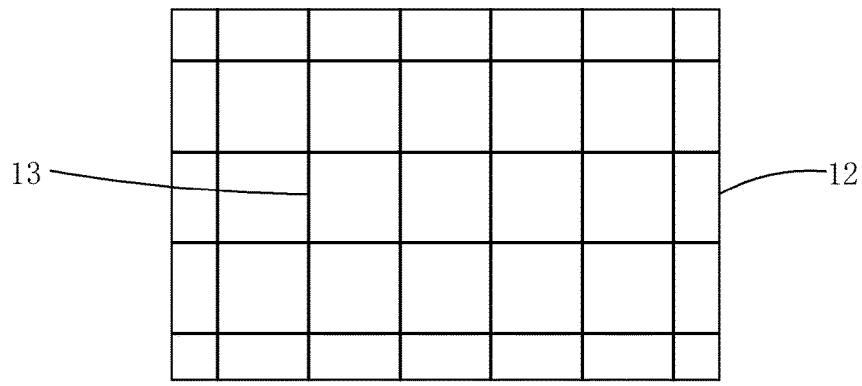
FIG. 3 is a top view diagram of one embodiment of an auxiliary conducting layer in the flexible OLED according to the present invention.

Preferably, the auxiliary conducting layer 13 appears to be a mesh shown in FIG. 3.

Figure 7:
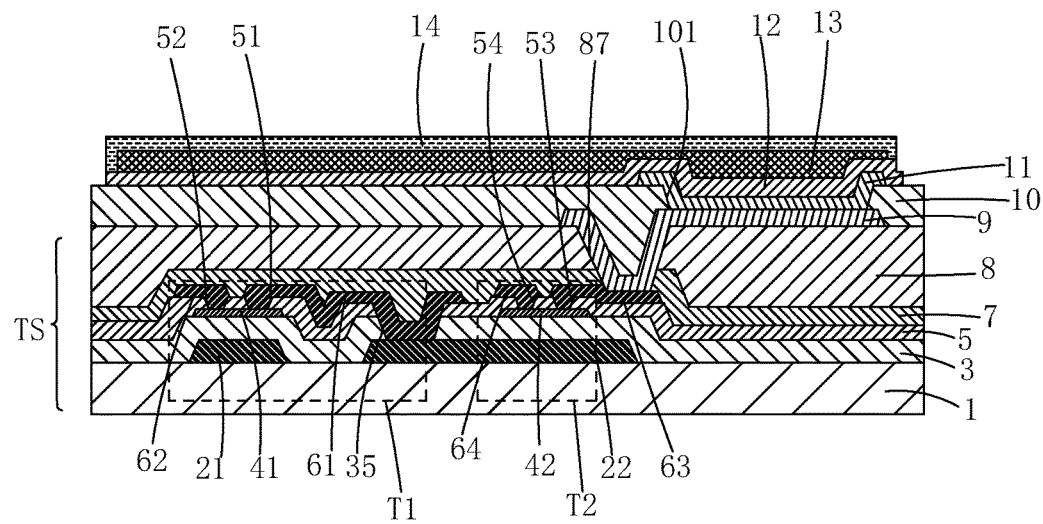
FIG. 7 is a diagram of the step 3 of the manufacture method of the flexible OLED according to the present invention.
Figure 8:
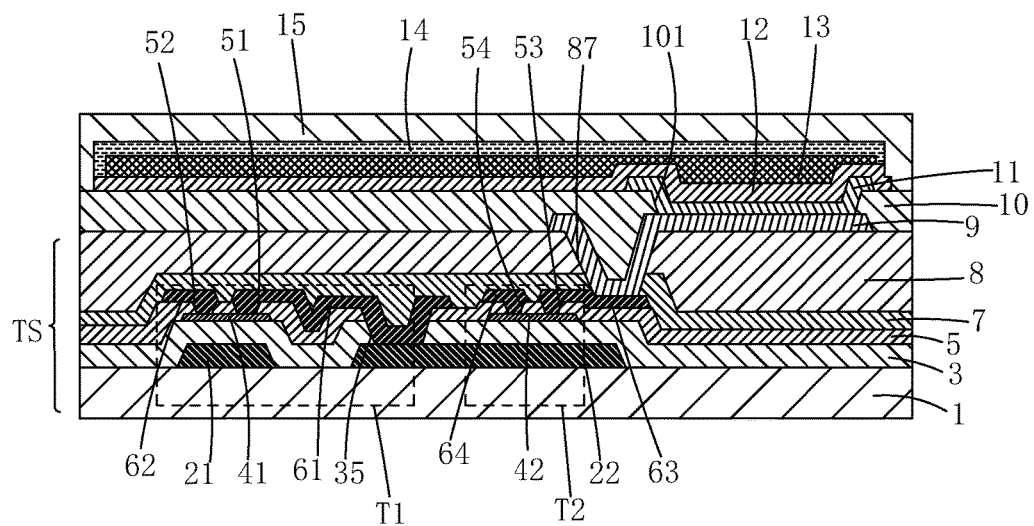
FIG. 8 is a diagram of the step 4 of the manufacture method of the flexible OLED according to the present invention.

Specifically, material of the auxiliary conducting layer 13 is conductive silver glue, silver nanowire or graphene. The silver nanowire means the transparent conductive thin film having nano level silver conductive mesh, and the line width of the silver nanowire is about 50 nm. The process of forming the auxiliary conducting layer 13 shown in FIG. 3 with the silver nanowire is: coating the silver nanowire ink material and utilizing the laser photolithography skill to draw the conductive mesh patterns of the silver nanowire.

step 3, as shown in FIG. 7, filling the dryer layer 14 on the auxiliary conducting layer 13 for removing the water vapor.

step 4, as shown in FIG. 8, forming the package thin film 15 on the dryer layer 14 and the pixel definition layer 10 for protecting the inner structure of the OLED.

In the aforesaid manufacture method of the flexible OLED according to the present invention, with forming the auxiliary conducting layer 13 covering the second electrode 12 on the second electrode 12, the current is conducted from the peripheral edge area to the central area of the electrode 12 and the voltage difference between the central area and the peripheral edge area of the electrode 12 can be decreased to diminish the current difference, and the brightness difference of the OLED. The issue of the uneven brightness can be improved; that is to say, even the thickness of the second electrode 12 is decreased, the conductivity still can be enhanced with the auxiliary conducting layer 13 to make the voltage difference between the central area and the peripheral edge area of the electrode 12 smaller.

A value range of a square resistance of the second electrode manufactured by prior art is 0.5-500Ω/□, and after forming the auxiliary conducting layer 13 covering the second electrode 12 on the second electrode 12 according to the manufacture method of the flexible OLED of the present invention, a value range of a square resistance of the second electrode 12 is narrowed down to 0.1-100Ω/□.

A thickness of the second electrode manufactured by prior art is 50-2000 Å, and after forming the auxiliary conducting layer 13 covering the second electrode 12 on the second electrode 12 according to the manufacture method of the flexible OLED of the present invention, a thickness of the second electrode 12 is 10-1000 Å.

In conclusion, the flexible OLED of the present invention is capable of decreasing the resistance of the second electrode and increasing the conducting ability to even the voltages of respective pixels, to improve the display homogeneity, and meanwhile, capable of reducing the thickness of the second electrode and saving the material of the second electrode by covering the auxiliary conducting layer on the second electrode. The manufacture method of the flexible OLED according to the present invention is capable of decreasing the resistance of the second electrode and increasing the conducting ability to even the voltages of respective pixels, to improve the display homogeneity, and meanwhile, capable of reducing the thickness of the second electrode and saving the material of the second electrode by forming the auxiliary conducting layer on the second electrode to cover the second electrode.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A flexible OLED, comprising:
   a TFT substrate, having a first electrode and a pixel definition layer on the TFT substrate, and the pixel definition layer has an open to expose a portion of the first electrode;
   an organic light emitting layer, and the organic light emitting layer is positioned on the first electrode in accordance with the open of the pixel definition layer;
   a second electrode, and the second electrode is positioned on the organic light emitting layer and the pixel definition layer;
   an auxiliary conducting layer, and the auxiliary conducting layer covers the second electrode for increasing a conducting ability of the second electrode to decrease a resistance of the second electrode and to reduce the thickness of the second electrode;
   a dryer layer, and the dryer layer is positioned on the auxiliary conducting layer; and
   a package thin film, and the package thin film is positioned on the dryer layer and the pixel definition layer.

2. The flexible OLED according to claim 1, wherein a value range of a square resistance of the second electrode is 0.1-100Ω/□.

3. The flexible OLED according to claim 1, wherein a thickness of the second electrode is 10~1000 Å.

4. The flexible OLED according to claim 1, wherein material of the auxiliary conducting layer is conductive silver glue, silver nanowire or graphene.

5. The flexible OLED according to claim 1, wherein the auxiliary conducting layer forms a mesh.

6. A manufacture method of a flexible OLED, comprising steps of:
   step 1, providing a TFT substrate, and sequentially forming a pixel electrode, and a pixel definition layer having an open to expose a portion of the first electrode on the TFT substrate;
   and then, forming an organic light emitting layer on the first electrode in accordance with the open of the pixel definition layer;
   and then, forming a second electrode on the organic light emitting layer and the pixel definition layer;
   step 2, forming an auxiliary conducting layer covering the second electrode on the second electrode for increasing a conducting ability of the second electrode to decrease a resistance of the second electrode and to reduce the thickness of the second electrode;

step 3, filling a dryer layer on the auxiliary conducting layer;

step 4, forming a package thin film on the dryer layer and the pixel definition layer.

7. The manufacture method of the flexible OLED according to claim 6, wherein in the step 2, coat, ink inject print or deposition is employed to form the auxiliary conducting layer.

8. The manufacture method of the flexible OLED according to claim 6, wherein material of the auxiliary conducting layer is conductive silver glue, silver nanowire or graphene.

9. The manufacture method of the flexible OLED according to claim 6, wherein a value range of a square resistance of the second electrode is 0.1-100Ω/□; and a thickness of the second electrode is 10~1000 Å.

10. The manufacture method of the flexible OLED according to claim 6, wherein the auxiliary conducting layer forms a mesh.

11. A manufacture method of a flexible OLED, comprising steps of:

step 1, providing a TFT substrate, and sequentially forming a pixel electrode, and a pixel definition layer having an open to expose a portion of the first electrode on the TFT substrate;

and then, forming an organic light emitting layer on the first electrode in accordance with the open of the pixel definition layer;

and then, forming a second electrode on the organic light emitting layer and the pixel definition layer;

step 2, forming an auxiliary conducting layer covering the second electrode on the second electrode for increasing a conducting ability of the second electrode to decrease a resistance of the second electrode and to reduce the thickness of the second electrode;

step 3, filling a dryer layer on the auxiliary conducting layer;

step 4, forming a package thin film on the dryer layer and the pixel definition layer;

wherein in the step 2, coat, ink inject print or deposition is employed to form the auxiliary conducting layer;

wherein material of the auxiliary conducting layer is conductive silver glue, silver nanowire or graphene;

wherein a value range of a square resistance of the second electrode is 0.1-100Ω/□; and a thickness of the second electrode is 10~1000 Å.

12. The manufacture method of the flexible OLED according to claim 11, wherein the auxiliary conducting layer forms a mesh.

* * * * *